United States Patent Office 3,752,669

Patented Aug. 14, 1973

3,752,669
METHOD OF PRODUCING POSITIVE IMAGES FROM EPOXY COMPOSITIONS AND COMPOSITIONS THEREFOR

Oscar Robert Abolafia, Endicott, N.Y., assignor to International Business Machines Corporation, Armonk, N.Y.

No Drawing. Filed Dec. 17, 1971, Ser. No. 209,356
Int. Cl. G03c 1/72, 5/00
U.S. Cl. 96—36.2 11 Claims

ABSTRACT OF THE DISCLOSURE

An epoxy composition suitable for use as a positive photoresist and permanent dielectric is disclosed which includes an epoxy resin, a tertiary amine curing agent, and a halogenated hydrocarbon sensitizer. Also disclosed is a method of producing positive images from said composition which includes exposing the coated epoxy to actinic radiation, curing the coating to a critical point at which the exposed areas remain soluble in a solvent developer while the unexposed areas are substantially insoluble, and subsequently developing out the exposed area in the solvent developer. The use of this composition and method in printed circuit manufacturing is also described.

BACKGROUND OF THE INVENTION

Field of the invention

This invention relates to epoxy formulations and a method of rendering them light sensitive. More specifically, the invention relates to an epoxy formulation which may be used as both a positive photoresist and a permanent dielectric in the manufacture of printed circuits.

Prior art

In manufacturing microelectronic circuitry in which densely packed circuitry requiring close tolerances are needed, simplification of the manufacturing process with the elimination of processing steps is desirable in order to reduce the possibility of processing defects. Commercially available photoresist compositions are generally used as temporary maskants during plating or etching steps in the manufacture of printed circuits. Removal of these resists by strong stripping solvents and subsequent application of permanent dielectrics add additional steps to the manufacturing process and increase the possibility of processing failures.

In multilayered printed circuitry, the layers are bonded together and electrically insulated from each other by a dielectric. The dielectric must have adequate electrical and adhesive properties to insulate the layers for the life of the circuit. Interconnecting vias between circuit layers are generally made by drilling holes through both the circuitry and the dielectric layer, and thereafter filling the hole with a conductive material, either by coating, plating or evaporation techniques. Such drilling operations are costly, time consuming, and severely limit the dimensional tolerances which can be maintained.

Chemically etching the holes through a mask can greatly increase the dimensional tolerances obtainable as well as lend itself to batch processing techniques unavailable in a drilling operation. The etching of holes through the metal circuitry may be readily accomplished. However, when the metal etchant, such as ferric chloride or ammonium persulphate reaches the dielectric adhesive layer, dissolution stops. The use of an organic solvent to dissolve away the dielectric in the via hole area, often results in dissolution, swelling and general deterioration of the dielectric film in the vicinity adjacent to the via hole area as well as at the edges of the multilayer circuit. Such deterioration can result in delamination of the multilayer circuit as well as shorting between circuit layers.

A method of overcoming the above mentioned deficiencies is by the use of a permanent dielectric material with good adhesive properties which can be readily dissolved by a solvent in the via hole area but which is unaffected by that solvent in adjoining areas or at the edge of the laminate. The use of a positive acting permanent dielectric, which is rendered more soluble in areas exposed to light, would be suitable for such an application.

While there are a number of commercially available positive photoresist compositions, such as Shiply AZ 1350, AZ 119, Eastman Kodak KR3, none of these materials have the chemical resistance, environmental resistance, or adhesive properties necessary for their use as a permanent dielectric film in a multilayer printed circuit laminate.

Epoxy resins, because of their excellent adhesive properties as well as good chemical and environmental resistance, have been found suitable as permanent dielectric materials in the preparation of printed circuitry. However, the solubility of cured epoxy resins are not affected by exposure to actinic radiation. Although negative acting epoxy coatings have been formulated in which the coating may be cured and rendered insoluble by exposure to light, such formulations cannot be used for the above mentioned multilayer circuit applications, since exposure to light of such a coating in the etched via hole areas would only render it more insoluble and more difficult to remove. A method of rendering an epoxy formulation light sensitive in this manner, i.e., insolubilizing the portions exposed to light, is taught in my application Ser. No. 158,541, filed June 30, 1971, "Light Sensitive Epoxy Formulation," assigned to the same assignee as the present invention.

Epoxy positive photoresist compositions are taught in Ser. No. 157,625, filed June 28, 1971, "Epoxy Positive Photoresist," and assigned to the same assignee as the present invention. However, the use of a halogenated anhydride in combination with primary or secondary amine curing agents, considerably shorten the effective shelf life of the compositions, making them less practical to store and use in large scale manufacturing operations. Extended storage may result in increased viscosity which make them more difficult to apply.

Accordingly, it is an object of this invention to formulate a dielectric material in such a manner that it may be made to behave as a positive photoresist under proper processing conditions and yet be suitable as a permanent dielectric and adhesive coating which may be easily stored and applied.

It is another object of this invention to provide a simpler method of fabricating reliable multilayer circuits with etched interconnecting holes than was heretofore possible.

Another object of this invention is to provide a method of manufacturing printed circuits in which it is unnecessary to remove the masking material since said materials serve as a permanent dielectric.

A method of producing visible images is provided by exposing said coating in a predetermined pattern to actinic radiation so that the epoxy image to be produced remains unexposed. Then, heating the coating for a time required to sufficiently cure the unexposed regions so that they are insoluble in a solvent developer but heating for a time less than that required to cure the exposed regions. The coating is then developed in a suitable solvent, thereby producing a visible image. The developed coating may be further hardened and cross linked by post-curing.

DETAILED DESCRIPTION OF THE INVENTION

(A) Epoxy formulation

An epoxy resin, capable of being converted to a useful thermosetting plastic film is used. Epoxy resins made from diglycidyl ethers of epichlorohydrin and bisphenol A, polyglycidyl ethers of phenol-formaldehyde, polyglycidyl ether of tetraphenylene ethane, and diglycidyl ether of resorcinol are examples of suitable resins. In combination with the epoxy resin, a tertiary amine curing agent is required. Although any tertiary amine curing agent is satisfactory, I prefer N,N,N',N'-tetramethyl, 1,3-butane diamine, benzyldimethylamine, 2-dimethylamino-2-hydroxypropane, 2-(dimethylaminomethyl) phenol, 2,4,6-tris (dimethylaminoethyl) phenol.

Also required is a halogenated hydrocarbon to act as a sensitizer upon exposure to light. Although many halogenated hydrocarbons are suitable as sensitizers, I prefer carbon tetrabromide since it is a solid at room temperature and will not evaporate, thereby ensuring a constant proportion of sensitizer to epoxy resin-curing agent. However, readily available halogenated hydrocarbon solvents such as methylene chloride, ethylene dichloride, chloroform, methylenedibromide, bromoform and ethylene dibromide may also be used. Additionally, other solids such as carbon tetraiodide, iodoform, and hexachlorobenzene may be employed.

In order to increase the crosslink density, latent crosslinking agents such as a dicyandiamide may be utilized. However, primary or secondary amine curing agents which react at or near room temperature should not be used. Finally, a suitable solvent which will substantially dissolve the other constituents of the composition, may be used if the formula is to be applied as a liquid coating. A halogenated liquid may be used as both a sensitizer and a solvent in the formulations contemplated by this invention.

It is not fully understood why a tertiary amine cured epoxy resin can be rendered slower curing upon the exposure to actinic radiation in the presence of the halogenated hydrocarbon. However, it is believed that on exposure to light, a free radical is produced which reacts with hydrogen to form a halogen acid. The acid then neutralizes the basic tertiary amine accelerator, substantially reducing its effective concentration in the epoxy formulation. Tertiary amines unlike primary or secondary amines act as true accelerators and small changes in concentration cause a significant change in cure rate. This effect on cure rate is greatest at low concentrations of tertiary amine. Thus, by incorporating a small but sufficient amount of tertiary amine curing agent into an epoxy formulation and then by rendering a portion of that tertiary amine unavailable for reaction with the epoxy resin through the use of a halogenated hydrocarbon sensitizer in the presence of light, a pronounced effect upon the curing properties of the exposed versus the unexposed areas is obtained.

(B) Method of producing positive images

On account of this pronounced difference in curing properties of the exposed versus the unexposed areas, the curing of the coating is regulated so that the unexposed areas are cured to a state in which they are substantially insoluble in organic solvents while the exposed areas are still in such an uncured state that they are substantially soluble in the same solvent. It should be noted that exposure of this system to light does not render the tertiary amines completely unreactive, but only less reactive, so that overcuring of the system may result in complete insolubilization of both the exposed and unexposed areas. The amount of cure as well as the amount of curing agent is critical in making the epoxy formulation behave as a positive photoresist.

Table I gives the time required to properly cure the epoxy formulation of Example II below, with varying amounts of N,N,N',N'-tetramethylbutane diamine curing agent so that satisfactory images are obtained.

TABLE I

| Percent of curing agent based on weight of resin: | Time for proper cure at 110° C., mins. |
|---|---|
| 1.5 | 12–20 |
| 2.0 | 10–16 |
| 2.5 | 9–14 |
| 3.0 | 8–12 |
| 3.5 | 7–11 |
| 4.0 | 6–9 |
| 4.5 | 5–8 |
| 5.0 | 4–6 |
| 5.5 | 4–5 |
| 6.0 | 3–4 |

By increasing the temperature of cure, the amount of time necessary for proper cure will proportionately decrease. However, by an increase in temperature or increase in curing agent, the allowable time range for proper cure is narrowed to a range where either under- or overcuring both the exposed and unexposed areas becomes extremely difficult to avoid.

After this critical cure, the coating may be solvent developed to form an image, and then further heated to fully cure the coated pattern.

(C) Method of producing printed circuits

The use of an epoxy photosensitive material has found special application in the manufacture of printed circuits. Usually, photosensitive materials used in the manufacture of printed circuits, both positive and negative reacting such as Kodak KPR 2 or Shiply's AZ 1350, serve only as temporary maskants used to define the circuit pattern during plating or etching. Although these materials possess sufficient chemical resistance to withstand metal etchants or plating baths, they do not possess the environmental or dielectric properties necessary to enable them to be used as the permanent dielectric of the printed circuit. As noted previously, they must be stripped in a strong organic solvent and a permanent dielectric must be applied. Epoxies, on the other hand, have been used for a number of years as the substrate material in printed circuits and possess superior dielectric properties and environmental resistance.

Epoxies' excellent adhesive characteristics also make them suitable as bonding agents in addition to their suitability as the permanent dielectric separator for multilayer circuits. The use of a positive acting light sensitive epoxy material as the adhesive and dielectric in multilayer circuits affords substantial advantages.

In accordance with this invention, a circuit pattern is photoetched using conventional photolithographic techniques from a copper clad substrate. The positive acting, light sensitive epoxy material is then coated onto the substrate by any suitable coating technique, such as spray, dip or roller coat. The epoxy coating is then allowed to dry to a substantially tack free condition, after which a second layer of copper is bonded to it. The bonding may be accomplished through the use of small amounts of heat and pressure, but care should be taken not to effect any substantial cure of the epoxy resin which would render it insoluble in an organic solvent developer.

An epoxy resin, at this stage, possesses sufficient chemical resistance to inorganic copper etchants, such as ferric chloride or ammonium persulfate so that etching of via holes through the top layer of copper has little or no effect upon the epoxy layer.

The via holes through the top layer of copper are formed using conventional photo-etching techniques. Covered by the top layer of copper in all but the via hole areas, the epoxy layer is now exposed to a light source for a sufficient period of time to render the tertiary amine curing agent noticeably less effective. Depending upon the particular epoxy composition employed as well as the thickness of the coating, exposures of 30 seconds to 5 minutes are used, although longer exposure times are generally not harmful. The circuit is then heated to a sufficient temperature and for a sufficient time to cure the unexposed coating so it is insoluble in a solvent developer. Care must be taken to not overcure the coating and render the exposed areas insoluble in the solvent developer.

The exposed epoxy coating in the via hole area is then dissolved and removed by a suitable solvent developer, such as methylene chloride. An interconnecting via is then plated up through the via hole from the first copper circuit to the second. If additional circuit layers are required, this process can be repeated using the photosensitive epoxy composition as an adhesive dielectric between subsequent layers.

The following are examples of epoxy formulations and methods of processing in accordance with this invention.

EXAMPLE 1

100 grams of a diglycidyl ether of bisphenol A resin having an epoxy equivalent weight of 475 to 575 is dissolved in 200 grams of methyl Cellosolve. 1.8 grams of N,N,N',N'-tetramethylbutane diamine and 5 grams of carbon tetrabromide is added to the mixture and dissolved. The solution is coated onto a substrate to a thickness of one mil, and exposed to a 500 watt mercury lamp in a predetermined pattern for 2½ minutes at a distance of one foot. The exposed film is then heated at 110° C. for 30 minutes. Development of an image is accomplished by immersing the film in methylene chloride for 30 seconds with a 15-second clean rinse in methylene chloride.

EXAMPLE 2

100 grams of an epoxy resin comprising 90% brominated diglycidyl ether of bisphenol A having an epoxy equivalent weight of 455 to 500 and 10% polyglycidyl ether of tetraphenylene ethane having an epoxy equivalent weight of 200 to 230 is dissolved in 25 grams of methylethylketone solvent. Two grams of benzyldimethylamine curing agent and 4 grams of dicyandiamide crosslinking agent are dissolved in 200 grams of a solvent mixture of 50% chloroform and 50% methyl Cellosolve and added to the epoxy resin solution. 5.0 grams of carbon tetrabromide sensitizer are then mixed into the solution until dissolved. A visible image is produced using the technique of Example 1 above.

EXAMPLE 3

100 grams of the reaction product of 90% of diglycidyl ether of bisphenol A having an epoxy equivalent weight of about 180, 5% methylene dianiline and 5% aniline is dissolved in 25 grams of methylethylketone solvent. (The reaction product has an epoxy equivalent weight of 375 to 450.) 4 grams of dicyandiamide cross-linking agent and 2 grams of N,N,N',N'-tetramethylbutane diamine curing agent in 200 grams of methyl Cellosolve solvent is added to the epoxy solution. 5 grams of carbon tetrabromide sensitizer are then mixed into the solution until dissolved. A coating of this formula is exposed and developed using the technique of Example 1 above. However, it is cured for a period of 13 minutes at 110° C.

While the invention has been shown and described with reference to preferred embodiments thereof, it will be appreciated by those of skill in the art that variations in form may be made therein without departing from the spirit and scope of the invention.

What is claimed is:

1. A composition suitable for use as a positive photoresist and dielectric comprising:
30 to 35 p.p.h. epoxy resin, 0.3 to 2 p.p.h. tertiary amine curing agent, 1–2 p.p.h. halogenated hydrocarbon sensitizer, 0–2 p.p.h. dicyandiamide cross-linking agent and the balance solvent.

2. The composition of claim 1 wherein the halogenated hydrocarbon sensitizer is carbon tetrabromide.

3. The composition of claim 1 wherein the tertiary amine curing agent comprises the group consisting of N,N,N',N' - tetramethyl - 1, 3 - butanediamine, benzyldimethylamine, 2-dimethylamino-2-hydroxypropane, 2-(dimethylaminomethyl) phenol, 2,4,6-tris (dimethylaminomethyl) phenol.

4. The composition of claim 1 wherein the epoxy resin is selected from the group consisting of diglycidyl ethers of epichlorohydrin and bisphenol A, polyglycidyl ethers of phenol-formaldehyde, polyglycidyl ether of tetraphenylene ethane, and diglycidyl ether of resorcinol.

5. A method of producing visible images comprising the steps of:
coating onto a substrate a composition comprising an epoxy resin, a tertiary amine curing agent and a halogenated hydrocarbon sensitizer;
exposing the coating in a predetermined pattern to actinic radiation so that the epoxy image to be produced remains unexposed;
heating the coating to cure the unexposed regions so that they are insoluble in a solvent developer, without fully curing the exposed regions which remain soluble in the solvent developer;
solvent developing the exposed coating to thereby produce a visible image.

6. The method of claim 5 wherein the tertiary amine curing agent comprises the group consisting of N,N,N',N'-tetramethyl-1, 3-butanediamine, benzyldimethylamine, 2-dimethylamino-2 - hydroxypropane, 2 - (dimethylaminomethyl) phenol, 2,4,6 - tris (dimethylamino methyl) phenol.

7. The method of claim 5 wherein the halogenated hydrocarbon sensitizer is carbon tetrabromide.

8. The method of claim 5 wherein the epoxy resin is selected from the group consisting of diglycidyl ethers of epichlorohydrin and bisphenol A, polyglycidyl ethers of phenol-formaldehyde, polyglycidyl ether of tetraphenylene ethane, and diglycidyl ether of resorcinol.

9. A method of producing visible images comprising the steps of:
coating onto a substrate a composition comprising 30 to 35 p.p.h. epoxy resin, 0.3 to 2 p.p.h. tertiary amine curing agent; 1–2 p.p.h. carbon tetrabromide sensitizer, 0–2 p.p.h. dicyandiamide cross-linking agent and the balance solvent;
exposing the coating in a predetermined pattern to actinic radiation so that the epoxy image to be produced remains unexposed;
heating the coating at about 110° C. to cure the unexposed regions so that they are insoluble in a solvent developer, without fully curing the exposed regions which remain soluble in the solvent developer;
solvent developing the exposed coating to thereby produce a visible image.

10. A method of preparing printed circuit boards including the steps of:
coating a copper cladded board with a composition comprising an epoxy resin, a tertiary amine curing agent, a halogenated hydrocarbon sensitizer, dissolved in a solvent;
exposing said coating to actinic radiation in a predetermined pattern;
heating said coating at about 110° C. to cure the unexposed regions so that they are insoluble in a solvent developer, without fully curing the exposed regions which remain soluble in the solvent developer;
solvent developing the exposed coating;
post curing the exposed coating;
conventionally metal plating the exposed coating.

11. A method of preparing multilayer printed circuit boards in which the dielectric layer can be preferentially dissolved to make interconnecting vias and including the steps of:

photoetching a first circuit pattern on a copper cladded board using conventional photoetching techniques;

laminating a second layer of copper onto the first circuit pattern using a photosensitive composition comprising an epoxy resin, a tertiary amine curing agent and a halogenated hydrocarbon sensitizer;

etching via-holes in said second layer of copper by conventional photoetching techniques;

exposing said photosensitive epoxy composition to actinic radiation through said via-holes;

heating the laminate at about 110° C. to cure the unexposed regions so that they are insoluble in a solvent developer without fully curing the exposed regions which remain soluble in the solvent developer;

solvent developing the epoxy coating in the via-hole area;

photoetching a second circuit pattern on said second layer of copper using conventional photoetching techniques;

depositing interconnecting vias from said first circuit pattern to said second circuit pattern through the developed photosensitive composition.

References Cited

UNITED STATES PATENTS

| | | | |
|---|---|---|---|
| 3,295,974 | 1/1967 | Erdmann | 96—35 |
| 3,019,106 | 1/1962 | Adams | 96—115 R |
| 3,074,869 | 1/1963 | Workman | 96—115 R |
| 3,136,637 | 6/1964 | Larson | 96—36.2 |
| 3,295,974 | 1/1967 | Erdmann | 96—115 R |
| 3,552,962 | 1/1971 | Notley et al. | 96—115 R |

NORMAN G. TORCHIN, Primary Examiner

A. T. SURO PICO, Assistant Examiner

U.S. Cl. X.R.

96—115 R; 117—34; 260—47 EP